United States Patent [19]

Nakamura et al.

[11] 4,308,481

[45] Dec. 29, 1981

[54] DAMPED MOUNTING FOR A PIEZOELECTRICALLY DRIVEN TUNING FORK RESONATOR

[75] Inventors: Takeshi Nakamura, Uji; Yoshimasa Yamashita, Kameoka, both of Japan

[73] Assignee: Murata Manufacturing Co., Ltd., Japan

[21] Appl. No.: 137,997

[22] Filed: Apr. 7, 1980

[30] Foreign Application Priority Data

Apr. 9, 1979 [JP] Japan ............................ 54/47238[U]

[51] Int. Cl.³ ........................................... H01L 41/08
[52] U.S. Cl. .................................... 310/321; 310/326
[58] Field of Search ................. 310/321, 326, 370, 25; 333/200

[56] References Cited

U.S. PATENT DOCUMENTS

| | | | |
|---|---|---|---|
| 3,984,790 | 10/1976 | Tanaka | 310/321 X |
| 3,986,150 | 10/1976 | Tanaka et al. | 310/321 X |
| 4,193,008 | 3/1980 | Nakamura | 310/321 |
| 4,220,885 | 9/1980 | Yamashita et al. | 310/321 |

Primary Examiner—Mark O. Budd
Attorney, Agent, or Firm—Ostrolenk, Faber, Gerb & Soffen

[57] ABSTRACT

A tuning fork resonator device includes a substrate having a recess formed in its one flat surface for receiving a damper made of an electrically conductive rubber and a metal leaf spring mounted on the substrate and being held in contact with the damper. A tuning fork is mounted on the damper through a support which is made of an electrical conductive material so as to electrically connect the tuning fork with the leaf spring.

9 Claims, 31 Drawing Figures

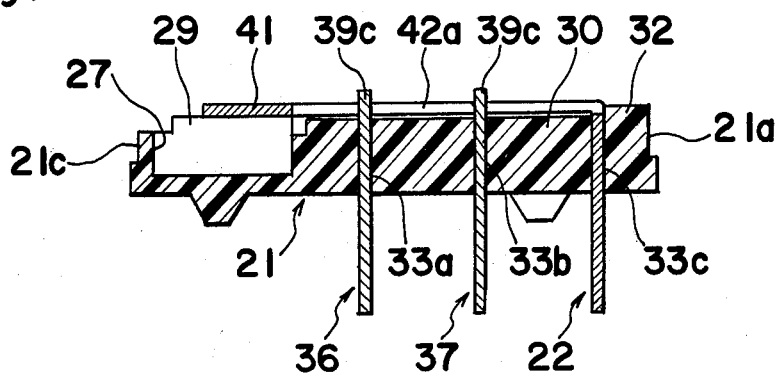
Fig. 7
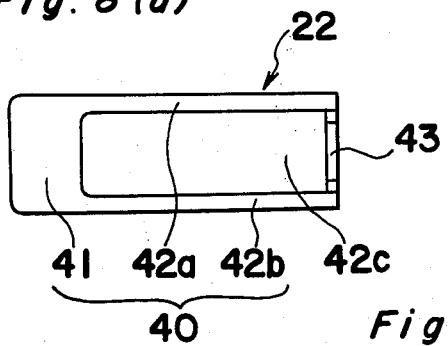
Fig. 8(a)
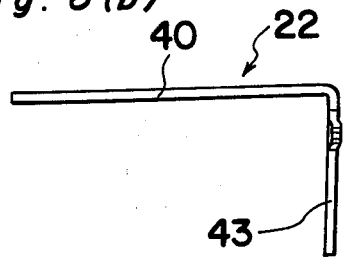
Fig. 8(b)
Fig. 8(c)
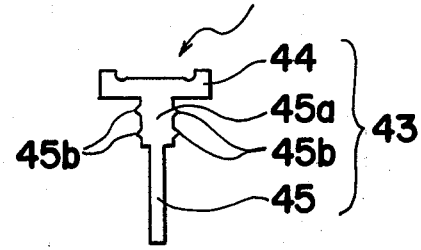
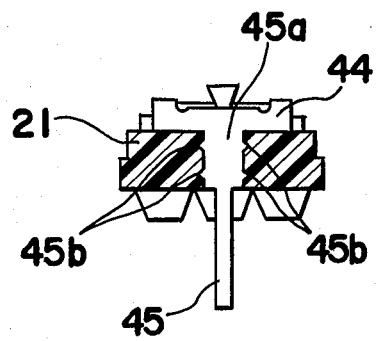
Fig. 9
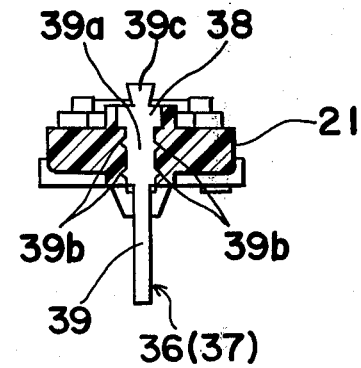
Fig. 10

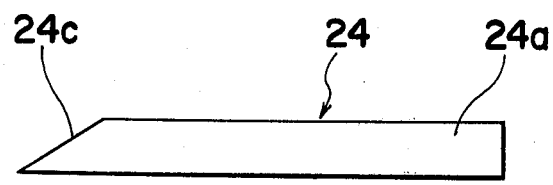
Fig. 14(a)
Fig. 14(b)
Fig. 14(c)
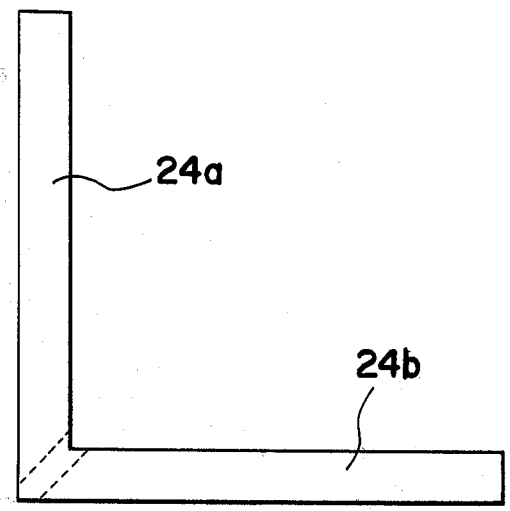

DAMPED MOUNTING FOR A PIEZOELECTRICALLY DRIVEN TUNING FORK RESONATOR

BACKGROUND OF THE INVENTION

The present invention relates to a tuning fork resonator device and, more particularly, to an assembly of the tuning fork resonator device which is less susceptible to an external impact or shock applied to the device.

The tuning fork resonator device is generally used in an oscillator in which the natural frequency of the tuning fork is converted into an electrical signal which is fed back to the tuning fork for the continual oscillation of the tuning fork, or it is used in an filter in which the tuning fork, among all the incoming signals, resonates in response to a particular signal having a frequency equal to the natural frequency of the tuning fork for filtering only the particular signal therethrough.

One conventional tuning fork resonator device is shown in FIG. 1. The conventional tuning fork resonator device of FIG. 1 includes a U-shaped tuning fork 1 made of a hard metal such as an Elinvar and having a base portion 1c and two arms 1a and 1b extending parallel to each other from the base portion 1c. The tuning fork 1 is supported on a substrate 4 by a supporting pin 3 projecting directly from the substrate 4. Piezoelectric elements 2a and 2b are electrically connected to terminal pins 5 and 6 through respective lead wires and are respectively deposited on the side surface of the arms 2a and 2b.

Although the tuning fork resonator device of FIG. 1 has a compact size with a simple structure, an external impact or shock applied to the casing 7 or substrate 4 is directly transmitted to the tuning fork 1 since the support pin 3 is directly connected to the substrate 4 and has a considerably short length for positioning the tuning fork 1 as close as possible to substrate 4. Thus, an undesirable shock noise is generated from the tuning fork 1. Therefore, the tuning fork resonator device of FIG. 1 can not be used at places where the shocks or impacts are often produced, for example, in the vehicle or near audio devices.

For the purpose of absorbing the shock, there has been proposed a tuning fork resonator device of FIGS. 2(a) and 2(b) including a U-shaped support member 8 having the ends affixed to the T-shaped terminal member 3. The U-shaped support member 8 has a tongue 8a extending from its base portion parallelly to the arms of the member 8. The end portion of the tongue 8a lies over a rubber damper 9 mounted on the base 4. The U-shaped support member 8 further has a projection 8b extending upwardly from a position adjacent to the tongue 8a for supporting the base portion 1c of the U-shaped tuning fork 1. According to this structure, a large shock or impact applied to the tuning fork resonator device can be absorbed by the resiliency of the long support member 8 and by the damper 9. However, it has been found that small impacts are not as effectively absorbed as the large impacts.

Another conventional tuning fork resonator device is shown in FIGS. 3(a) and 3(b) including a cubic rubber 11 surrounded and held in position by a frame 4a installed on the substrate 4 and a bar 10 made of Elinvar and inserted into an opening formed in the cubic rubber 11 for supporting a pair of vibrating arms 1a and 1b attached to the bar 10 by a brazing method. For electrically connecting the tuning fork with the terminal pin 3, a lead wire 15 is extended between the terminal pin 3 and the bar 10. The employment of the lead wire 15 increases the steps of the soldering process during the manufacture of the device. Additionally, since the bar 10 is made of an Elinvar, it is difficult to deposite solder beads on the bar 10. Therefore, it is necessary to use a special solder to solder the lead wire 15 onto the bar 10, thus complicating the manufacturing steps. Furthermore, since the wire 15 extends almost tightly between the bar 10 and the pin 3, the wire 15 may be forcibly cut by the applied impacts.

Moreover, since the bar 10 extends vertically from the substrate 4 with one end portion supported by the rubber damper 11 and the other end portion supporting the vibrating arms 1a and 1b, the height of the tuning fork resonator device is considerably high.

FIGS. 4(a) and 4(b) show a further conventional tuning fork resonator device having a pair of walls 13 and 14 each carrying a rubber plate 11 in such a manner as to define a predetermined gap between the rubber plates 11. The base portion of the tuning fork, that is, where the vibrating arms 1a and 1b are held together by a spacer 12 made of Elinvar is tightly held in the gap between the rubber plates 11. To ensure that the base portion of the tuning fork is held between the rubber plates 11, the contacting surface between the base portion and the rubber plates has to be considerably large in area or the tuning fork may easily be removed from its proper position. Therefore, in addition to above mentioned disadvantages, the tuning fork resonator device of FIGS. 4(a) and 4(b) has the disadvantage that its size in the longitudinal direction is considerably large.

SUMMARY OF THE INVENTION

Accordingly, it is a primary object of the present invention to provide an improved tuning fork resonator device which effectively absorbs the external shock or impact before such a shock reaches the tuning fork.

It is another object of the present invention to provide a tuning fork resonator device of the above described type which is compact in size and simple in construction with less manufacturing steps.

It is a further object of the present invention to provide a tuning fork resonator device of the above described type which can be manufactured at low cost.

In accomplishing these and other objects, a tuning fork resonator device according to the present invention comprises a substrate made of an electrically non-conductive material and having an engaging portion formed in its one surface. A leaf spring made of an electrically conductive material is mounted on the substrate. The leaf spring has a pressure applying plate portion which is overlying a portion of the recess. A damper made of an electrically conductive elastic material is engaged in the engaging portion and held in contact with the pressure applying plate portion of the leaf spring. A support made of an electrically conductive material has a first portion mounted in the damper and a second portion protruding outwardly from the damper. The tuning fork resonator device further comprises a tuning fork having a base portion rigidly connected to the second portion of the support and two vibrating arms extending from the base portion.

BRIEF DESCRIPTION OF THE DRAWINGS

These and other objects and features of the present invention will become apparent from the following description taken in conjunction with preferred embodiments thereof with reference to the accompanying drawings, throughout which like parts are designated by like reference numerals, and in which:

FIGS. 1 to 4(b) have already been referred to in the foregoing description, FIG. 1 being a perspective view of one conventional tuning fork resonator device; FIGS. 4(a) and 4(b) being top and side plan views, respectively, of a still further conventional tuning fork resonator device;

FIG. 7 is a cross-sectional view taken along the line VII—VII shown in FIG. 6;

FIG. 8(a) is a top plan view of a leaf spring;

FIG. 8(b) is a side plan view of the leaf spring of FIG. 8(a);

FIG. 8(c) is an end view of the leaf spring of FIG. 8(a);

FIG. 9 is a cross-sectional view taken along the line IX—IX shown in FIG. 6;

FIG. 10 is a cross-sectional view taken along the line X—X shown in FIG. 6;

FIGS. 14(a) and 14(b) are side and bottom views, respectively, of a tuning fork;

FIG. 14(c) is a top plan view of a cut out piece used for forming the tuning fork of FIGS. 14(a) and 14(b);

DETAILED DESCRIPTION OF THE INVENTION

Figure 5:
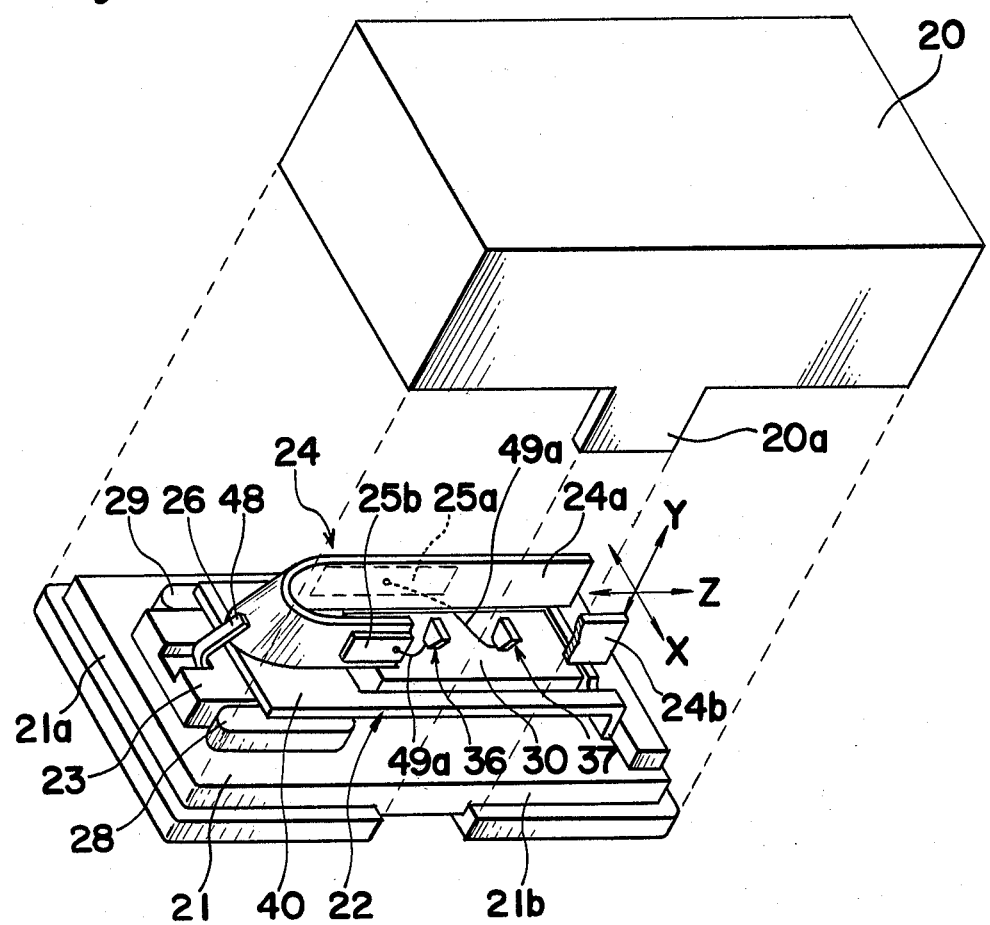
FIG. 5 is an exploded perspective view of a tuning fork resonator device according to the present invention.

Referring to FIG. 5, a tuning fork resonator device of the present invention comprises a substrate 21 made of an electrically non-conductive material, such as a synthetic resin, a leaf spring member 22 made of an electrically conductive material, such as a metal, and rigidly mounted on the substrate 21 at its one end, a damper 23 made of an electrically conductive rubber and held between the substrate 21 and a free or distal end of the leaf spring member 22 remote from the end where it is mounted on the substrate 21, a support member 26 made of an electrically conductive material, such as metal, and affixed to the rubber damper 23, and a bifurcated tuning fork 24 firmly supported by the support member 26. Each of the elements mentioned above is described in detail below.

Figure 6:
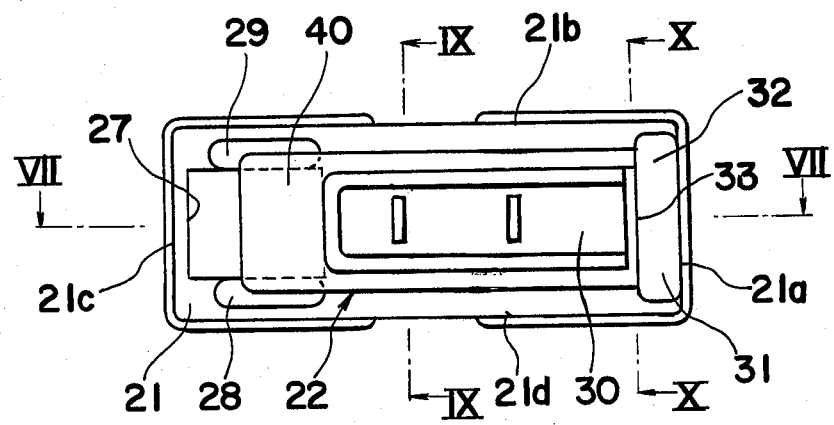
FIG. 6 is a top plan of a substrate of the tuning fork resonator device of FIG. 5 with a leaf spring mounted thereon.

Referring to FIGS. 6 and 7, the substrate 21 has, when viewed from top, a rectangular shape defined by four sides 21a, 21b, 21c and 21d. The substrate 21 is formed with a rectangular recess 27 adjacent to the side 21c for fittingly receiving therein the rubber damper 23. A pair of guide projections 28 and 29 extend upwardly from opposite side walls of the recess 27 adjacent to the sides 21b and 21d, respectively, for guiding the insertion of the rubber damper 23 and for preventing the inserted rubber damper 23 from producing an undesirable shaking motion. An elongated rectangular projection 30 is formed on the substrate 21 adjacent to the recess 27 and approximately at a central portion of the substrate 21. The substrate 21 is further formed with an elongated projection 32 along the side 21a of the substrate 21 and spaced a predetermined distance from the projection 30 for defining a groove or gap between the projections 30 and 32. The substrate 21 has three holes 33a, 33b and 33c formed therein through the direction of its thickness. The holes 33a and 33b have their openings located in the projection 30 with a predetermined distance spaced from each other, and are provided for tightly receiving terminal members 36 and 37 in a manner which will be described in detail later in connection with FIG. 10. The hole 33c is located at the center of the groove between the projections 30 and 32, and is provided for tightly receiving the leaf spring member 22 in a manner described in detail later in connection with FIG. 9.

Referring to FIGS. 8(a), 8(b) and 8(c), the leaf spring member 22 is constituted by a spring portion 40 and a support portion 43 which are so held in an angled relation to each other that the angle contained by the spring portion 40 and the support portion 43 is slightly less than 90 degrees. The spring portion 40 has two arms 42a and 42b extending parallel to each other and a pressure applying plate 41 connected to one end of each arm 42a, 42b. The other end of each arm 42a, 42b is connected to the support portion 43 so as to define a rectangular opening 42c between the arms 42a and 42b. It is to be noted that the opening 42c is larger than the size of the rectangular projection 30 projecting from the substrate 21. The support portion 43 has a wing 44, to which the arms 42a and 42b are connected at its respective ends, and a terminal leg 45 projecting from the center portion of the wing 44. The terminal leg 45 has, at a portion adjacent to the wing 44, a widened portion 45a provided with four detent projections 45b. Preferably, the spring member 22 is formed from a phosphor bronze using a cutting method with the spring portion 40 bent relative to the support portion 43.

To mount the spring member 22 on the substrate 21, the support portion 43 is forcibly inserted into the hole 33c with the spring portion 40 held above the substrate 21 until the wing 44 fittingly terminates in the gap between the projections 30 and 32. When the support portion 43 is so inserted, the terminal leg 45 projects downwardly from the substrate 21, while the widened portion 45a is fittingly held in the hole 33c with the detent projections 45b being firmly engaged with the inner wall of the hole 33c, as shown in FIG. 9. Furthermore, when the support portion 43 is so inserted, the opposite edges of the plate 41 which are, respectively, in alignment with the arms 42a and 42b are brought into contact with the top end of each of the guide projections 28 and 29 for overlaying the plate 41 above a portion of the recess 27. Since the opening 42c defined in the spring portion 40 is larger than the size of the projection 30, the arms 42a and 42b and the plate 41 are spaced from the projection 30.

Referring to FIG. 10, each of the terminal members 36 and 37 has a similar configuration to that of the support portion 43 of the spring member 22 except that each of the terminal members 36 and 37 has narrower wings. More particularly, each terminal member has a wing portion 38 and a terminal leg 39 extending from the center portion of the wing portion 38. The terminal leg 39 has, at a portion adjacent to the wing 38, a widened portion 39a provided with four detent projections 39b. Each terminal member further has a head portion 39c projecting from the wing portion 38 in a direction opposite to the terminal leg 39.

To mount each of the terminal members (e.g., 36) on the substrate 21, the terminal leg 39 is forcibly inserted into the opening 33a until the head portion 39c is located immediately above the top surface of the projection 30. When the terminal member is so inserted, the terminal leg 39 projects downwardly from the substrate 21, and the widened portion 39a is fittingly held in the respective hole with the detent projections 39b being firmly engaged with the inner wall of the hole.

Figure 11:
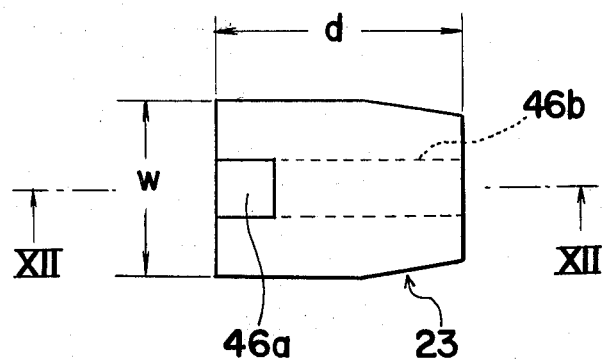
FIG. 11 is a top plan view of a damper.
Figure 12:
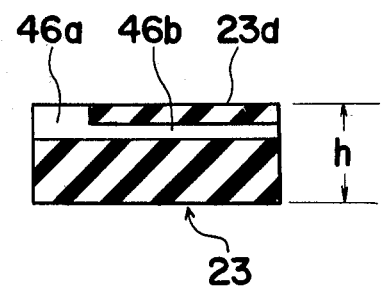
FIG. 12 is a cross-sectional view taken along the line XII—XII shown in FIG. 11.

Referring to FIGS. 11 and 12, the damper 23 is formed by an electrically conductive rubber, such as an electrically conductive silicon rubber product No. 87C40 (a product of Shin-Etsu Polymer Co., Ltd. of Japan) having resistivity of 50 Ωcm, modulus of elasticity at 200%, strength of 50 kg/cm$^3$ and hardness of 65 H°. The damper 23 has, when viewed from top, a rectangular shape with one end narrowed in width. The width w and the length d of the damper 23 is slightly greater than those of the recess 27 for firmly inserting the damper 23 in the recess 27. The height h of the damper 23 as shown in FIG. 12 is greater than the sum of depth of the recess 27 and the height of the guide projection 28, 29 so as to locate a top surface 23a of the damper 23 above the top surface of the guide projections 28 and 29. The damper 23 is formed with an opening 46a in its top surface adjacent to one side remote from the side having a narrow width and a hole 46b extending in its lengthwise direction from the bottom of the opening 46a to the side having a narrow width.

To insert the damper 23 into the recess 27, narrow end of the damper 23 is inserted into recess 27 and the damper 23 is forcibly pushed between the guide projections 28 and 29 and under the pressure applying plate 41 of the spring member 22. The damper 23 is then forcibly pushed down into the recess 27 until its bottom surface contacts the bottom of the recess 27. To secure the damper 23 in the inserted position, it is preferable to apply bonding agent between the damper 23 and the recess 27. Since the height of the damper 23 is greater than the sum of the depth of the recess 27 and the height of the guide projection 28, 29, the top surface 23a of the damper 23 is disposed above the top of the guide projections 28 and 29. Thus, the top surface of the damper 23 is held in contact with the pressure applying plate 41. For securing the contact, an electrically conductive bonding agent can be deposited between the damper 23 and the plate 41.

Figure 13:
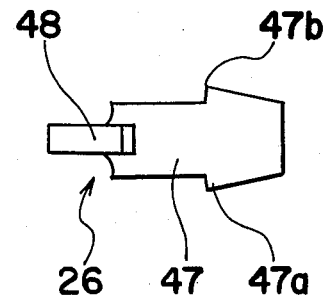
FIGS. 13(a) and 13(b) are top and side plan views, respectively, of a support member.
Figure 13:
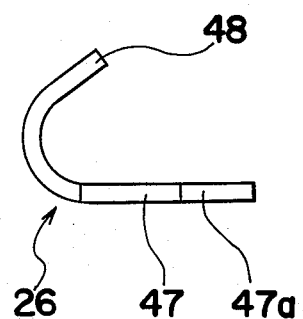

Referring to FIGS. 13(a) and 13(b), the support member 26 has a rectangular plate portion 47 having a width generally wider than the width of the hole 46b formed in the damper 23. The plate portion 47 has a pair of detent projections 47a and 47b extending laterally from its opposite elongated side edges. A support arm 48 extends from one short side edge of the plate portion 47 and is bent in a shape of a hook. The support member 26 is attached to the damper 23 in such a manner that the plate portion 47 is forcibly inserted into the hole 46b to project the support arm 48 outwardly and upwardly from the opening 46a. When the plate portion 47 is so inserted into the hole 46b, the detent projections 47a and 47b are firmly engaged with the inner wall of the hole 46b. It is to be noted that the support member 26 may be attached to the damper 23 before or after the damper 23 is inserted into the recess 27. It is possible to integrally form the damper 23 and the support member 26 together.

Referring to FIGS. 14(a), 14(b) and 14(c), the bifurcated tuning fork 24 is formed by a metal plate having a low temperature coefficient of elasticity modulus, such as an Elinvar, and includes two vibrating parallel arms 24a and 24b and a base portion 24c from which the arms 24a and 24b extend. For forming the tuning fork, an L-shaped piece (FIG. 14(c)) or a V-shaped piece (not shown) is cut out from a solid plate and is bent at its corner portion as defined between dotted lines (FIG. 14(c)) for confronting the arms with each other. The outer surface of each vibrating arm opposite to the surface facing the other arm is deposited with a piezoelectric element at an intermediate portion thereof where the loop of vibration exists. More particularly, a piezoelectric element 25a (FIG. 5) made of a barium titanate ($BaTiO_3$) is deposited on the arm 24a and a similar piezoelectric element 25b is deposited on the arm 24b. The piezoelectric elements 25a and 25b are electrically connected to the head portion 39c of the terminal members 36 and 37, respectively, through lead wires 49a and 49b. The base portion 24c of the tuning fork 24 is rigidly connected to the support arm 48 of the support member 26 by any known method such as a spot welding.

Since the damper 23 is made of an electrically conductive material, the tuning fork 24 is electrically connected to the leaf spring member 22 through the support member 26 and the damper 23. Therefore, the electrical potential at the base portion 24c of the tuning fork 24 can be detected at the terminal leg 45 of the spring member 22.

According to a preferred embodiment of the present invention, an aluminum casing 20 (FIG. 5) is mounted on the substrate 21. To facilitate the attachment of the casing 20 to the substrate 21, the substrate 21 is formed with a flange around its peripheral sides except a central portion of the sides 21b and 21d for engagingly inserting therethrough fastening projections 20a extending from corresponding side edges of the casing 20. After the casing 20 has been mounted on the substrate 21, the projections 20a are bent along the bottom surface of the substrate 21 for tightly holding the casing 20 and the substrate 21 together.

According to the present invention, since the damper 23 is formed from an electrically conductive material, it is not necessary to extend a wire between the base portion of the tuning fork 24 and the terminal leg 45 of the spring member 22.

Furthermore, since the tuning fork 24 is supported on the substrate 21 through the damper 23, a shock or an impact applied to the substrate 21 or casing 20 will not be directly applied to the tuning fork 24. Therefore, the level of the shock noise in the signal produced from the piezoelectric elements 25a and 25b will be considerably reduced. The reduction of the shock noise is apparent from the result of tests carried out by the present inventors as described below.

In the tests, a mechanical shock or impact was applied to the tuning fork resonator device of the present invention from three different directions, i.e., a direction corresponding to the direction of vibration of the tuning fork (referred to as an X-direction), a direction perpendicular to the direction of vibration of the tuning fork (referred to as a Y-direction) and a direction perpendicular to a surface defined by the X- and Y-directions (referred to as a Z-direction). For detecting the shock noise, an oscilloscope was employed. The wave forms of the noises detected through the oscilloscope (vertical sensitivity=50 mV/div.; and sweep speed=10 ms/div.) are shown in FIGS. 15(a), 15(b) and 15(c) which were resulted from the impacts of X-direction, Y-direction and Z-direction, respectively.

Figure 1:
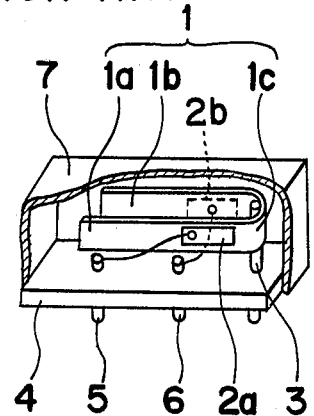
Figure 2A:
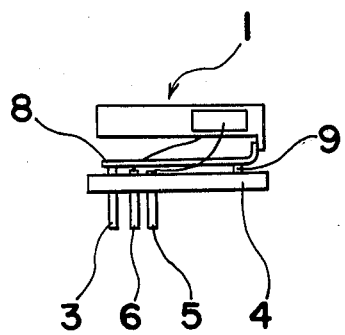
FIG. 2(a) being a side plan view of another conventional tuning fork resonator device.
Figure 2B:
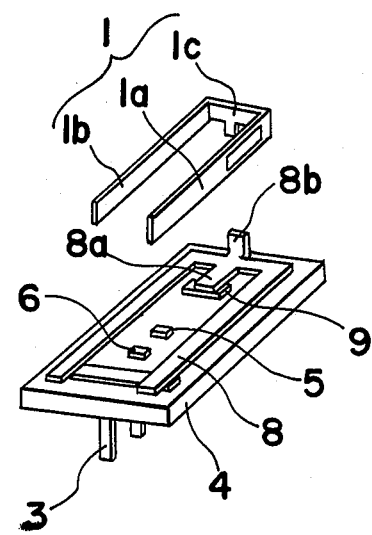
FIG. 2(b) being an exploded perspective view of the conventional tuning fork resonator device of FIG. 2(a)
Figure 3A:
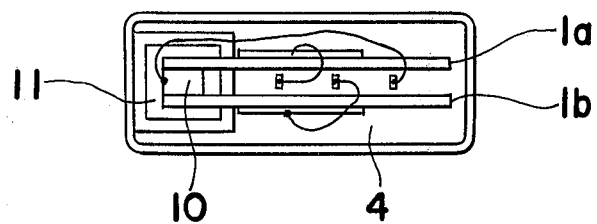
FIGS. 3(a) and 3(b) being top and side plan views, respectively, of a further conventional tuning fork resonator device.
Figure 3B:
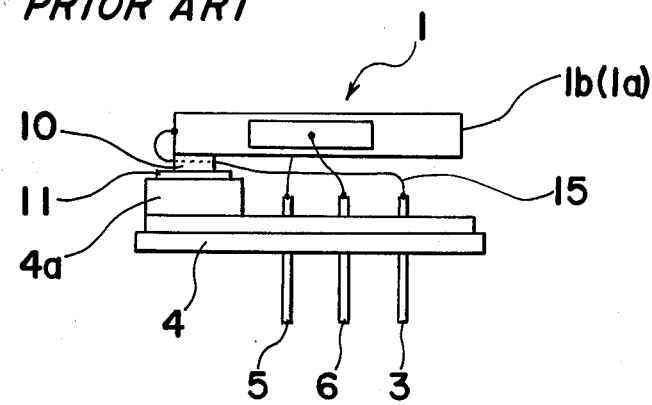
Figure 4A:
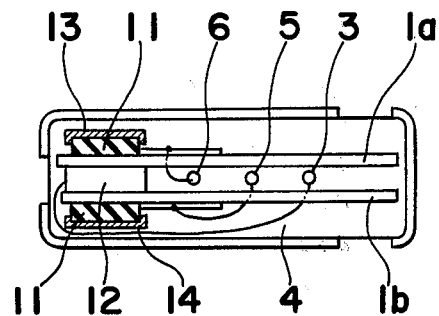
Figure 4B:
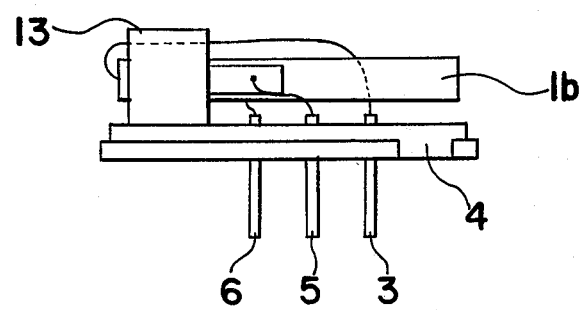

Similarly, the impacts from three different directions were also applied to the conventional tuning fork resonator device, such as one shown in FIG. 1. The shock noises produced from the conventional tuning fork resonator device as a result of X-direction impact, Y-direction impact and Z-direction impact are shown in wave forms in FIGS. 16(a), 16(b) and 16(c), respectively.

Figure 15A:
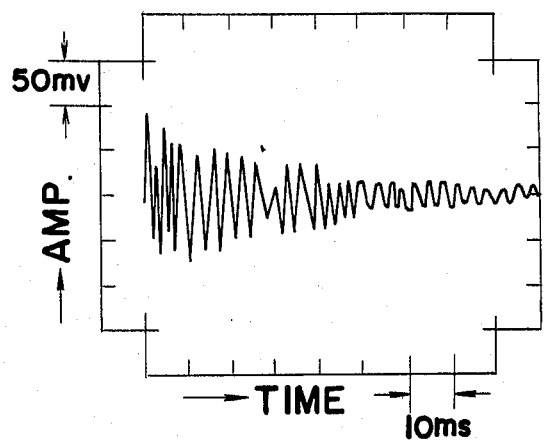
FIGS. 15(a), 15(b) and 15(c) are wave forms obtained from an oscilloscope when the tuning fork resonator device of the present invention was tested.
Figure 15B:
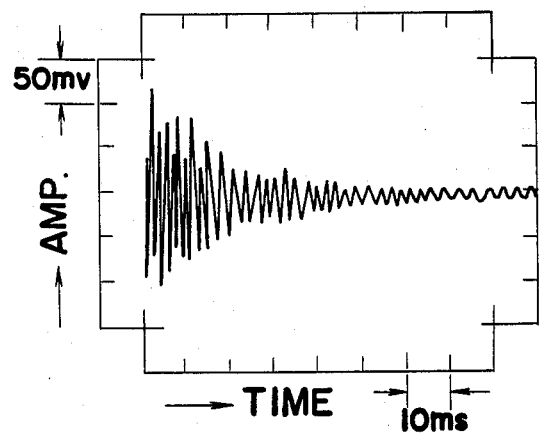
Figure 15C:
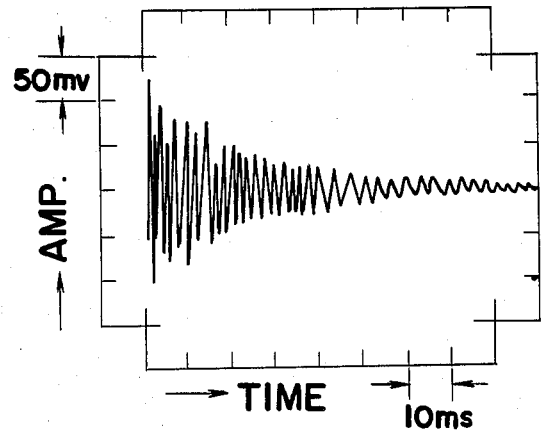
Figure 16A:
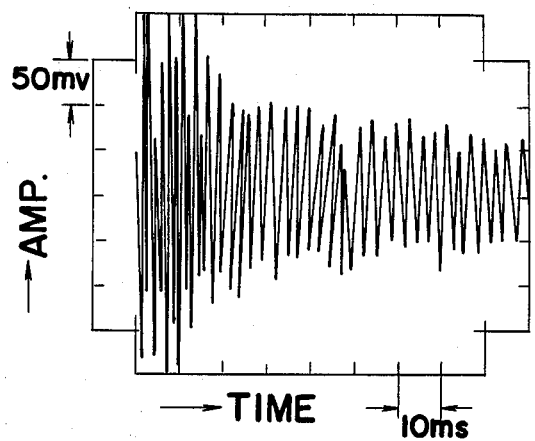
FIGS. 16(a), 16(b) and 16(c) are wave forms obtained from an oscilloscope when the conventional tuning fork resonator device was tested.
Figure 16B:
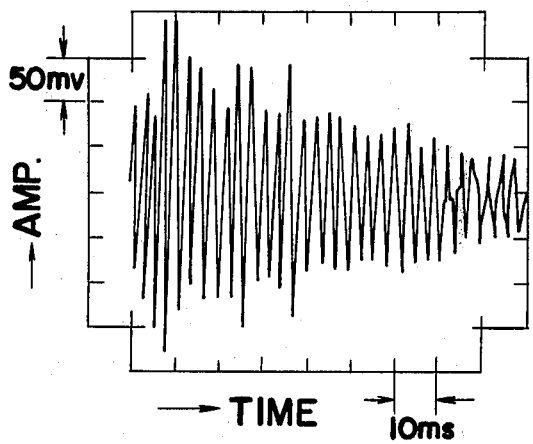
Figure 16C:
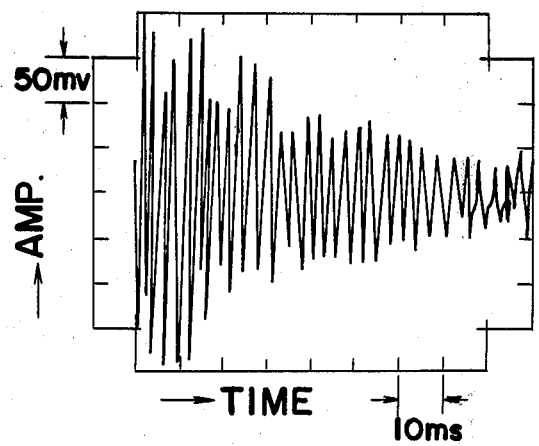

When wave forms of FIGS. 15(a), 15(b) and 15(c) are compared with wave forms of FIGS. 16(a), 16(b) and 16(c), it is understood that the maximum output level of the shock noise produced from the tuning fork resonator device of the present invention ranges between 150 mVpp to 200 mVpp, whereas that produced from the conventional tuning fork resonator device ranges above 400 mVpp. Furthermore, the time required for the tuning fork resonator device of the present invention to reduce the shock noise level below 100 mVpp is about 10 ms to 20 ms, whereas the conventional tuning oscillator takes more than 80 ms to attain such a shock noise reduction.

As understood from the above comparison, the arrangement of the tuning fork resonator device according to the present invention has an advantage in absorption of the external impact or shock.

Figure 17A:
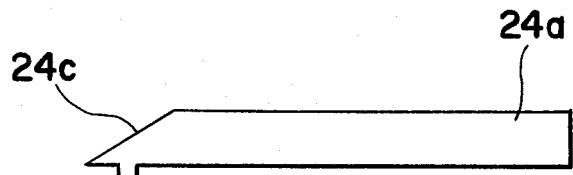
FIGS. 17(a), 17(b) and 17(c) are views similar to FIGS. 14(a), 14(b) and 14(c), respectively, but particularly showing a modification of the tuning fork.
Figure 17B:
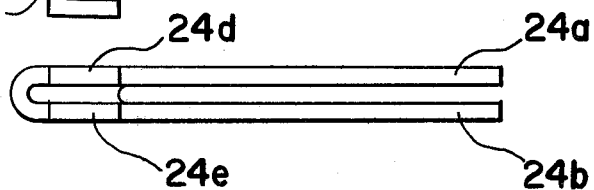
Figure 17C:
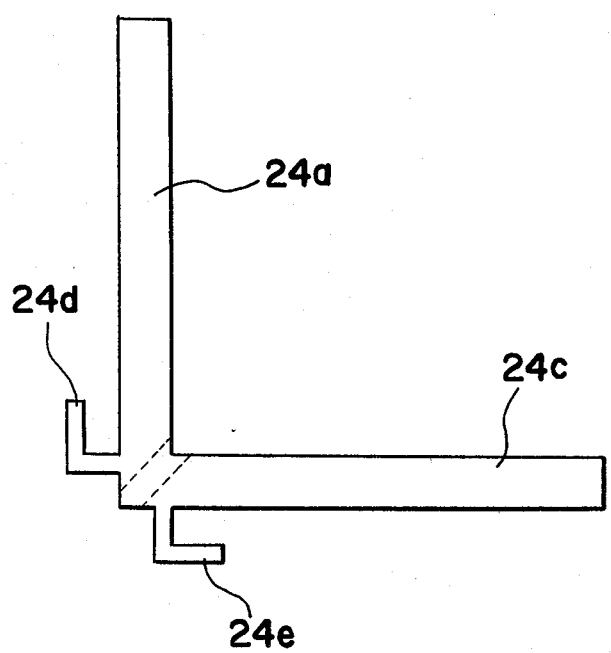

Referring to FIGS. 17(a), 17(b) and 17(c), there is shown a modification of the tuning fork 24. The tuning fork in this modification has a pair of L-shaped leg projections 24d and 24e extending downwardly from its base portion 24c where the node of the vibration exists. Instead of employing a support member 26, the tuning fork 24 of this modification can be directly mounted on the damper 23 by the insertion of the leg projections 24d and 24e into the hole 46b of the damper 23.

It is to be noted that the tuning fork 24 can be formed in a U-shaped tuning fork as shown in FIG. 1.

Although the present invention has been fully described with reference to a preferred embodiment, many modification and variations thereof will now be apparent to those skilled in the art, and the scope of the present invention is therefore to be limited not by the details of the preferred embodiment described above, but by the terms of the appended claims.

What is claimed is:
1. A tuning fork resonator device, comprising:
a substrate means made of an electrically non-conductive material and having an engaging portion formed in one of its surfaces;
leaf spring means made of an electrically conductive material and mounted on said substrate means, said leaf spring means having a pressure applying plate portion which overlies a portion of said engaging portion;
damper means made of an electrically conductive elastic material and engaged by said engaging portion and held in contact with said pressure applying plate portion of said leaf spring means;
support means made of an electrically conductive material and having a first portion mounted in said damper means and a second portion protruding outwardly from said damper means; and
tuning fork means having a base portion and two vibrating arms extending from said base portion, said base portion being rigidly connected to said second portion of the support means.

2. A tuning fork resonator device as claimed in claim 1, wherein said engaging portion is a recess, said damper means being mounted in said recess.

3. A tuning fork resonator device as claimed in claim 2, wherein said substrate means further has a pair of guide projections along opposite side edges of said recess, respectively.

4. A tuning fork resonator device as claimed in claim 1, wherein said leaf spring means has a spring portion in which said pressure applying plate portion is included and a leg portion which is connected to said spring portion and is rigidly mounted in said substrate means, a portion of said leg portion protruding outwardly from said substrate means for the external electrical connection thereto, said leaf spring means being electrically connected to said base portion of said tuning fork means.

5. A tuning fork resonator device as claimed in claim 1, wherein said damper means is made of an electrically conductive rubber.

6. A tuning fork resonator device as claimed in claim 1, wherein said damper means has a hole formed therein for tightly receiving said first portion of said support means.

7. A tuning fork resonator device as claimed in claim 6, wherein said first portion of said support means has detent projection means engaging an inner wall defining said hole in said damper means.

8. A tuning fork resonator device as claimed in claim 6, wherein said second portion of said support means is held in an angled relation to said first portion of said support means.

9. A tuning fork resonator device as claimed in claim 1, wherein said tuning fork means and said support means are formed integrally.

* * * * *